(12) United States Patent
Chen et al.

(10) Patent No.: US 10,211,295 B2
(45) Date of Patent: Feb. 19, 2019

(54) SUBSTRATE FOR SEMICONDUCTOR DEVICE AND SEMICONDUCTOR DEVICE USING THE SAME

(71) Applicant: National Chi Nan University, Puli Township, Nantou County (TW)

(72) Inventors: Jiann-Heng Chen, Puli Township (TW); Puru Lin, Puli Township (TW); Sun-Zen Chen, Puli Townhip (TW)

(73) Assignee: National Chi Nan University, Puli Township, Nantou County (TW)

( * ) Notice: Subject to any disclaimer, the term of this patent is extended or adjusted under 35 U.S.C. 154(b) by 0 days.

(21) Appl. No.: 15/614,612

(22) Filed: Jun. 6, 2017

(65) Prior Publication Data

US 2017/0373155 A1 Dec. 28, 2017

(30) Foreign Application Priority Data

Jun. 27, 2016 (TW) .............................. 105120144 A

(51) Int. Cl.
*H01L 33/30* (2010.01)
*H01L 29/04* (2006.01)
(Continued)

(52) U.S. Cl.
CPC ...... *H01L 29/2003* (2013.01); *H01L 21/0262* (2013.01); *H01L 21/02389* (2013.01);
(Continued)

(58) Field of Classification Search
CPC ......... H01L 21/02389; H01L 21/02488; H01L 29/2003; H01L 33/30; H01L 21/0242;
(Continued)

(56) References Cited

U.S. PATENT DOCUMENTS

| | | | | |
|---|---|---|---|---|
| 5,320,990 A | * | 6/1994 | Guiton | C04B 35/581 264/671 |
| 5,622,769 A | * | 4/1997 | Kozuka | H01L 23/15 174/137 A |

(Continued)

OTHER PUBLICATIONS

Arkles et al. High Density Silicon Dioxide Coating by Uv and Thermal Processing. Silicones in Coatings III Mar. 28-30, 2000, Barselona, Spain, pp. 1-8.*

*Primary Examiner* — Galina G Yushina
(74) *Attorney, Agent, or Firm* — IPR Works, LLC

(57) ABSTRACT

The present invention provides a substrate for a semiconductor device and a semiconductor device using the same. The substrate for a semiconductor device comprises a ceramic supporting base plate formed by a polycrystalline aluminum nitride (AlN) sintered body; at least one silicon oxide layer formed on the base plate by a sol-gel method wherein the at least one silicon oxide layer has an average roughness less than the base plate to block polycrystalline orientation of the base plate and has a total thickness in a range of 10~5000 nm, the silicon oxide layer is only formed from the sol-gel method and is not single crystalline; a first buffer layer comprising aluminum nitride (AlN) on the at least one silicon oxide layer with a thickness of 0.1~10 μm; and a gallium nitride layer formed on the first buffer layer and having a single-crystal crystalline structure.

9 Claims, 5 Drawing Sheets

(51) Int. Cl.
  *H01L 29/20* (2006.01)
  *H01L 41/318* (2013.01)
  *H01L 21/02* (2006.01)
  *H01L 29/739* (2006.01)

(52) U.S. Cl.
  CPC ............ *H01L 29/04* (2013.01); *H01L 29/045* (2013.01); *H01L 29/7393* (2013.01); *H01L 33/30* (2013.01); *H01L 41/318* (2013.01); *H01L 21/0242* (2013.01); *H01L 21/0254* (2013.01); *H01L 21/02458* (2013.01); *H01L 21/02488* (2013.01); *H01L 21/02491* (2013.01); *H01L 21/02502* (2013.01); *H01L 21/02505* (2013.01)

(58) Field of Classification Search
  CPC ......... H01L 21/02433; H01L 21/02595; H01L 21/0298; H01L 27/14694; H01L 29/045; H01L 41/318; H01L 33/075
  See application file for complete search history.

(56) References Cited

U.S. PATENT DOCUMENTS

| | | | |
|---|---|---|---|
| 2003/0020396 A1* | 1/2003 | Yano | C09K 11/7731 313/503 |
| 2011/0147772 A1* | 6/2011 | Lochtefeld | C30B 29/06 257/94 |
| 2012/0092389 A1* | 4/2012 | Okuyama | G09F 9/33 345/690 |
| 2013/0285065 A1* | 10/2013 | Zhu | H01L 21/02458 257/76 |
| 2013/0308671 A1* | 11/2013 | Yoo | H01L 33/0079 372/46.01 |
| 2014/0161980 A1* | 6/2014 | Cremer | C03C 17/25 427/379 |
| 2015/0084163 A1* | 3/2015 | Shikauchi | H01L 21/02381 257/615 |
| 2016/0118501 A1* | 4/2016 | Nabatame | H01L 29/66969 257/43 |
| 2017/0345663 A1* | 11/2017 | Ishizuka | H01L 21/304 |

* cited by examiner

SUBSTRATE FOR SEMICONDUCTOR DEVICE AND SEMICONDUCTOR DEVICE USING THE SAME

BACKGROUND OF THE INVENTION a. Field of the Invention

The invention relates to a substrate for a semiconductor device and a semiconductor device using the same, particularly to a substrate containing a smooth silicon oxide layer for a semiconductor device and a semiconductor device using the same.

b. Description of the Related Art

Aluminum nitride is a ceramic material having electric insulation and high heat-dissipation properties because of its high thermal conductivity, crystalline structure and direct band gap properties to be extensively used as a substrate for a variety of electronic devices. A substrate is required to not only have a good heat-dissipation property but also easily grow desirable crystalline structures thereon to fabricate a semiconductor device. The heat generated in the semiconductor device has to be quickly dissipated to avoid malfunction due to overheat in the device. Particularly, a light emitting device such as high brightness light emitting diode (LED) has the heat-dissipation problem because of the excessive amount of heat generated during operation.

Furthermore, since aluminum nitride has the crystalline structure being the same Wurtzite structure as gallium nitride (GaN), and has the lattice parameter matched with GaN and the similar thermal expansion coefficient to GaN, aluminum nitride is suitable to be a substrate or a base layer to grow gallium nitride. Besides, aluminum nitride has the good heat-dissipation property to be a substrate for a GaN-series semiconductor device. Especially, the high heat-dissipation is more suitable to be applied to high power LED.

Although aluminum nitride has the above mentioned advantages, single crystalline aluminum nitride plates as substrates for semiconductor devices are not popular because of the high cost problem. Besides, usually the aluminum nitride plate is a thin-cut substrate while used as a single crystalline aluminum nitride substrate. However, the thin-cut aluminum nitride plate has no enough thickness to possess the desired heat dissipation functionality. According to the disclosure from U.S. Pat. No. 7,465,991, a semiconductor substrate includes a GaN, AlN or ALGaN useful layer and a relatively thick supporting substrate from polycrystalline aluminum nitride but a mono-crystalline SiC, Si(111) or sapphire thin layer should be present between the supporting substrate and the useful layer. That is, when a polycrystalline or amorphous sintered bulk body is to be used as a semiconductor substrate, various measures should be taken to grow the subsequent mono-crystalline gallium nitride layers to proceed to fabricate the desired semiconductor device.

BRIEF SUMMARY OF THE INVENTION

In light of the above background, in order to fulfill the requirements of the industry, one object of the invention provides a substrate for a semiconductor device and a method for manufacturing a substrate for a semiconductor device by forming a smooth silicon oxide layer via solution coating as a buffer layer on a rough starting base material (substrate).

Another object of the invention provides a substrate for a semiconductor device and a semiconductor device using the same by use of a polycrystalline aluminum nitride sintered bulk body to provide a low-cost substrate instead of the use of the high-cost single crystalline substrate. Besides, the present invention uses the sintered bulk body to increase the heat dissipation efficiency, forms the smooth silicon oxide layer via solution coating on the rough surface of the sintered bulk body (polycrystalline aluminum nitride ceramic plate) and then grows the aluminum nitride epitaxial layer to provide a substrate ready for the epitaxial growth such as forming a GaN layer and light emitting layer.

In order to achieve one of the above purposes, all the purposes, or other purposes, one embodiment of the invention provides a substrate for a semiconductor device, comprising a supporting base plate made of ceramics and formed by a polycrystalline aluminum nitride (AlN) sintered bulk body; at least one silicon oxide layer formed on the base plate by a sol-gel method wherein the at least one silicon oxide layer has an average roughness less than the base plate to block polycrystalline orientation of the base plate and has a total thickness in a range of 10~5000 nm, the silicon oxide layer is only formed from the sol-gel method and is not single crystalline; a first buffer layer comprising aluminum nitride (AlN) formed on the at least one silicon oxide layer with a thickness of 0.1~10 μm and having a preferred orientation (0002) AlN crystalline structure; and a gallium nitride layer formed on the first buffer layer and having a single-crystalline crystalline structure.

According to another embodiment of the invention provides a method for manufacturing a substrate for a semiconductor device, comprising: providing a supporting base plate made of ceramics and formed by a polycrystalline aluminum nitride (AlN) sintered bulk body; performing a sol-gel process to form a silicon oxide layer at least one time wherein the sol-gel process is performed 1~10 times, the average roughness of the top layer of the at least one silicon oxide layer is less than 25 nm and the at least one silicon oxide layer has a total thickness in a range of 10~5000 nm; using metal-organic chemical vapor deposition to form a first buffer layer which comprises aluminum nitride (AlN) formed on the at least one silicon oxide layer; and using metal-organic chemical vapor deposition to form a gallium nitride layer formed on the first buffer layer and having a single-crystal crystalline structure.

According to the present invention, a substrate for a semiconductor device and a method for manufacturing a substrate for a semiconductor device are provided to achieve high heat dissipation efficiency without using any high-cost single crystalline substrate through formation of a buffer layer(s).

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

Figure 1:
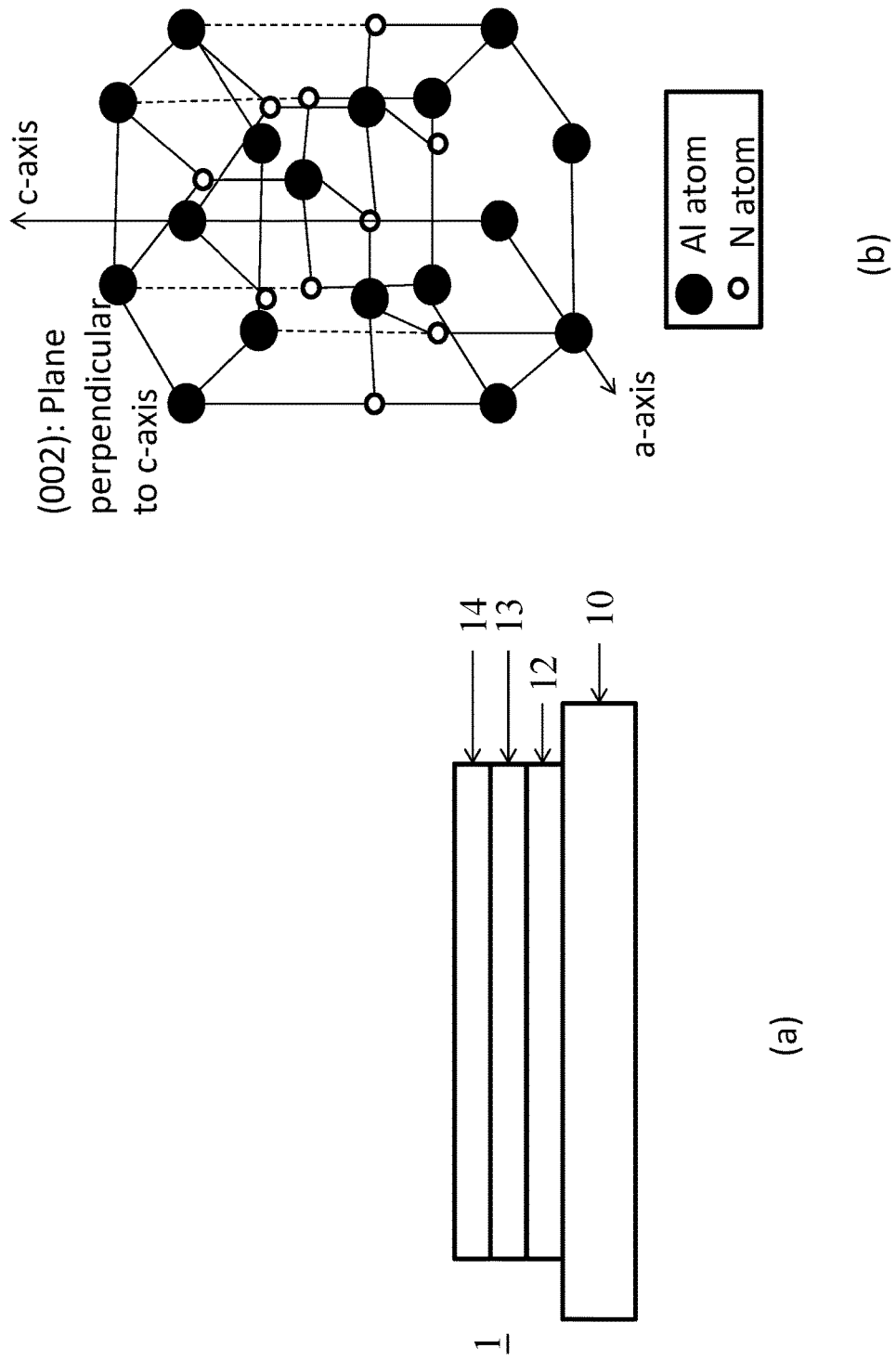
FIG. 1 shows a schematic diagram illustrating (a) a substrate for a semiconductor device according to example 1 of the invention (b) the AlN crystalline structure where the preferred orientation (002) is the plane perpendicular to c-axis.

In the following detailed description of the preferred embodiments, reference is made to the accompanying drawings which form a part hereof, and in which are shown by way of illustration specific embodiments in which the invention may be practiced. The drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The common structures and elements that are known to everyone are not described in details to avoid unnecessary limits of the invention. Some preferred embodiments of the present invention will now be described in greater detail in the following.

A first embodiment of the invention discloses a substrate for a semiconductor device. The substrate comprises a ceramic supporting base plate, at least one silicon oxide layer, a first buffer layer and a gallium nitride layer. The supporting base plate is made of ceramics and formed by a polycrystalline aluminum nitride (AlN) sintered bulk body. The at least one silicon oxide layer is formed on the base plate by a sol-gel method and the silicon oxide layer has an average roughness less than the base plate to block polycrystalline orientation of the base plate and has a total thickness in a range of 10~5000 nm. The silicon oxide layer is only formed from the sol-gel method and is not single crystalline. The first buffer layer comprises aluminum nitride (AlN) formed on the at least one silicon oxide layer with a thickness of 0.1~10 μm and has a preferred orientation (002) AlN crystalline structure. The gallium nitride layer is formed on the first buffer layer and has a single-crystalline crystalline structure.

Preferably, the average roughness of the top layer of the at least one silicon oxide layer is less than 25 nm. As there are multiple silicon oxide layers, the silicon oxide layer which is the farthest away from the base plate preferable has an average roughness less than 10 nm or close to 0 nm. The at least one silicon oxide layer can have 1~10 layers, and preferable 1~5 layers.

Specifically, the method for forming the silicon oxide layer(s) is, for example, to use a spin-on glass coating (SOG) material such as hydrogen silsesquioxane (HSQ) to form a layer of silicon oxide and then dry the coating layer (for example, set under 120° C. for 2 min and heat to 345° C. by controlling the heating rate). When 2 layers of silicon oxide are to be formed, the above method is repeated twice. The thickness of one silicon oxide layer after dried is about in the range of 10~100 nm.

The ceramic supporting base plate is made of aluminum nitride or is a ceramic base plate containing aluminum, for example formed by a polycrystalline aluminum nitride (AlN) sintered bulk body. The "bulk body" in the present specification means the thickness is thick, compared to its cross section, that is, in some case if necessary, the thickness could be greater than or close to the other two dimensions, the width and the length, which forms the surface the silicon oxide layer is formed thereon.

In one embodiment, the above mentioned substrate further comprises a titanium/platinum layer (Ti/Pt layer; titanium layer and/or platinum layer) formed on the at least one silicon oxide layer. The titanium layer has a thickness of 1~100 nm and/or the platinum layer has a thickness of 5~1000 nm. The "titanium/platinum layer" indicates the layer is formed by a titanium layer only, a platinum layer only or a layer including the titanium layer and platinum layer.

A second embodiment of the invention discloses a method for manufacturing a substrate for a semiconductor device. The method comprises the following steps, providing a supporting base plate made of ceramics and formed by a polycrystalline aluminum nitride (AlN) sintered bulk body; performing a sol-gel process to form a silicon oxide layer at least one time wherein the sol-gel process is performed 1~10 times, the average roughness of the top layer of the at least one silicon oxide layer is less than 25 nm and the at least one silicon oxide layer has a total thickness in a range of 10~5000 nm; using metal-organic chemical vapor deposition to form a first buffer layer which comprises aluminum nitride (AlN) formed on the at least one silicon oxide layer; and using metal-organic chemical vapor deposition to form a gallium nitride layer formed on the first buffer layer and having a single-crystal crystalline structure. The supporting base plate is made of ceramics and formed by a polycrystalline aluminum nitride (AlN) sintered bulk body.

In the method for manufacturing a substrate for a semiconductor device, the sol-gel process to form a silicon oxide layer can be performed 1~10 times, preferably 1~5 times. Thus, the substrate according to the present invention has at least one silicon oxide layer. The silicon oxide layer has an average roughness less than the base plate to block polycrystalline orientation of the base plate and has a total thickness in a range of 10~5000 nm. The silicon oxide layer which is the farthest away from the supporting base plate has the smoothest surface, that is has the smallest average roughness among the multiple laminated layers of the silicon oxide layers.

The method for manufacturing a substrate for a semiconductor device, can further comprises a step of using metal-organic chemical vapor deposition or physical vapor deposition to form a titanium/platinum layer (titanium layer and/or platinum layer) on the at least one silicon oxide layer wherein the titanium layer has a thickness of 1~100 nm and the platinum layer has a thickness of 5~1000 nm.

The substrate manufactured using the method according to the present invention can be applied in a semiconductor device, such as a light emitting diode, insulated gate bipolar transistor, etc.

For example, a semiconductor device using the above mentioned substrate comprises a supporting base plate, made of ceramics and formed by a polycrystalline aluminum nitride (AlN) sintered bulk body; at least one silicon oxide layer formed on the base plate by a sol-gel method wherein the at least one silicon oxide layer has an average roughness less than that of the base plate to block polycrystalline orientation of the base plate and has a total thickness in a range of 10~5000 nm, the silicon oxide layers are only formed from the sol-gel method and are not single crystalline; a first buffer layer formed on the at least one silicon oxide layer wherein the first buffer layer is of aluminum nitride (AlN) and has a thickness of 10~50000 nm and a preferred orientation (002) AlN crystalline structure; a gallium nitride layer formed on the first buffer layer and having a single-crystal crystalline structure; a light emitting layer on the gallium nitride layer wherein the light emitting layer is a n-type layer and has a single-crystal crystalline structure; and a p-type layer on the light emitting layer.

Figure 2:
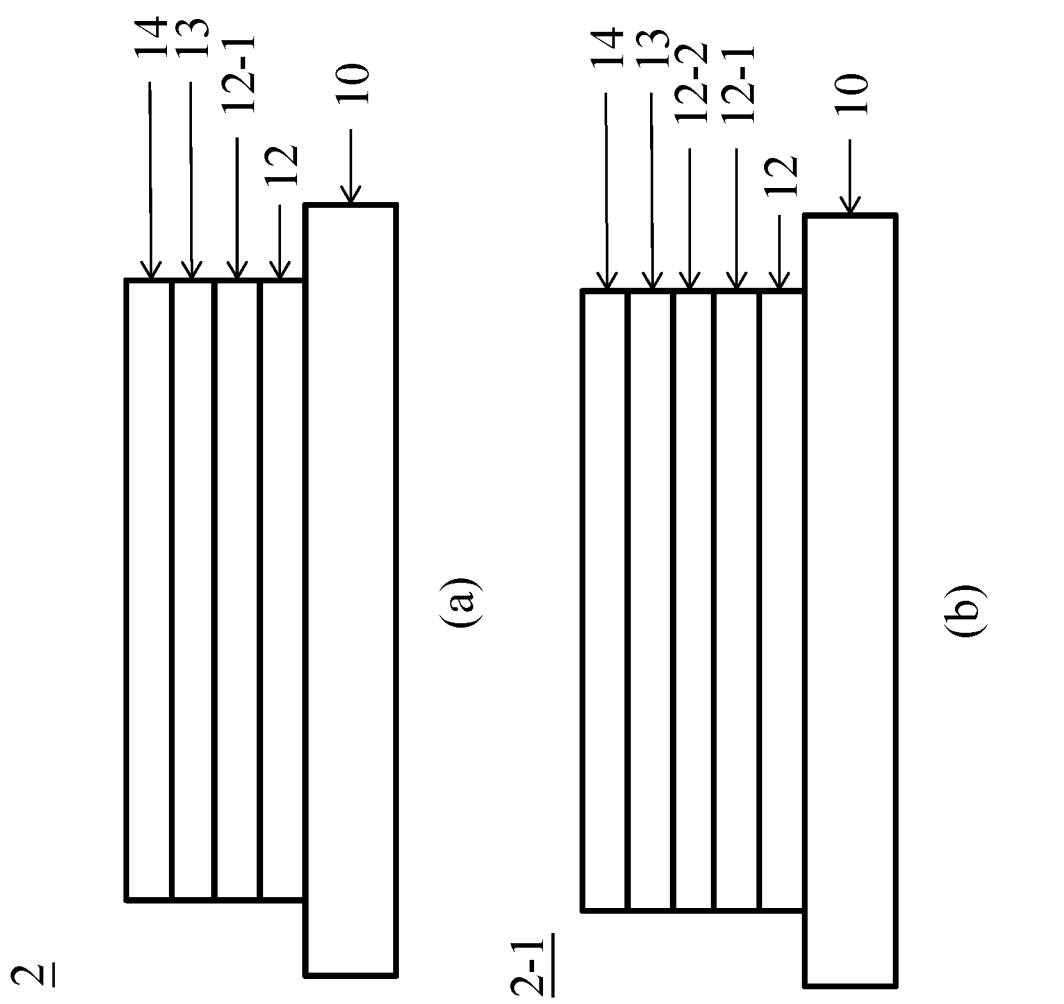
FIG. 2 shows a schematic diagram illustrating a substrate for a semiconductor device according to example 2 of the invention.

Specifically, FIG. 1(a) shows a schematic diagram illustrating a substrate for a semiconductor device according to example 1 of the invention. As shown in FIG. 1(a), the substrate 1 comprises a ceramic supporting base plate 10, a silicon oxide layer(s) 12, a first buffer layer 13 and a gallium nitride layer 14. The silicon oxide layer(s) 12 was formed, for example, by using a spin-on glass coating (SOG) material such as hydrogen silsesquioxane (HSQ) to form a layer of silicon oxide by spin coating or spraying (sol-gel method) and then dry the coating layer (for example, set under 120° C. for 2 min and heat to 345° C. by controlling the heating rate). The thickness of one silicon oxide layer after dried is about in the range of 10~100 nm, preferably 30~100 nm. The first buffer layer 13 has a preferred orientation (002) AlN crystalline structure, shown in FIG. 1(b). FIG. 2 shows a schematic diagram illustrating a substrate for a semiconductor device according to example 2 of the invention. The substrates 2 and 2-1 in FIG. 2 have the similar structures as the substrate 1 in FIG. 1 except the silicon oxide layers 12-1 and 12-2. The substrate 2 in FIG. 2(a) has two layers of silicon oxide layers and the substrate 2-1 in FIG. 2(b) has three layers of silicon oxide layers. That is, the sol-gel process were repeated once or twice (preforming two or three times) for the substrates 2 and 2-1, respectively, during the method for manufacturing the substrate. In such a method, the surface of the substrate can be further smoothed. The gallium nitride layer 14 has a single crystalline structure.

Figure 3:
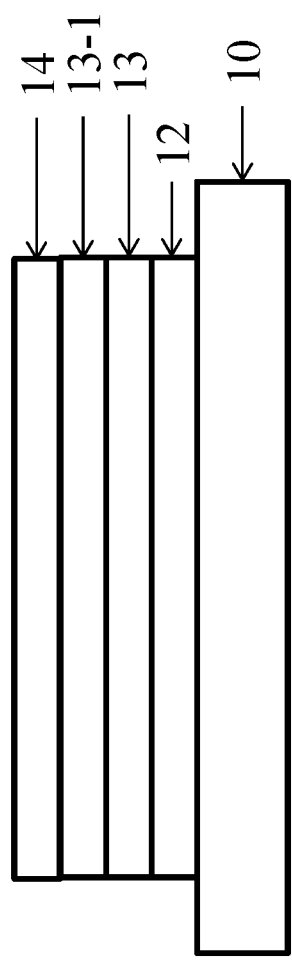
FIG. 3 shows a schematic diagram illustrating a substrate for a semiconductor device according to example 3 of the invention.

FIG. 3 shows a schematic diagram illustrating a substrate for a semiconductor device according to example 3 of the invention. The substrate 3 additionally has a titanium/platinum layer 13-1 (Ti/Pt layer; titanium layer and/or platinum layer). The rest of the structure is the same as that in FIG. 1. The method to form the titanium/platinum layer 13-1 is for example to use metal-organic chemical vapor deposition or physical vapor deposition to deposit a titanium thin film and then form a platinum thin film to form the titanium/platinum layer 13-1. The titanium layer has a thickness of 1~100 nm and the platinum layer has a thickness of 5~1000 nm. The titanium/platinum layer 13-1 can assist the formation of single crystalline gallium nitride as the gallium nitride layer 14. However, the titanium/platinum layer 13-1 is optional. That is, in another embodiment, the substrate can have no titanium/platinum layer 13-1.

Figure 4:
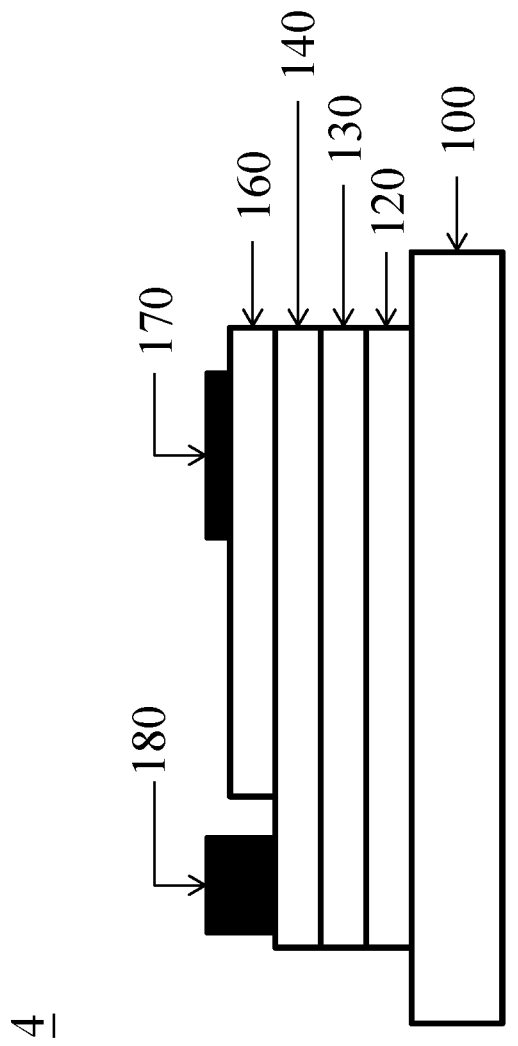
FIG. 4 shows a schematic diagram illustrating a semiconductor device according to example 4 of the invention.

FIG. 4 shows a schematic diagram illustrating a semiconductor device according to example 4 of the invention. The semiconductor device 4 comprises a supporting base plate 100, at least one silicon oxide layer 120, a first buffer layer 130, an n-type layer 140, a p-type layer 160, a contact electrode 170 in contact with the p-type layer 160, a contact electrode 180 in contact with the n-type layer 140. The supporting base plate 100 has the same structure and composition as the supporting base plate 10. The at least one silicon oxide layer 120 has the same structure and composition as the at least one silicon oxide layer 12. The first buffer layer 130 has the same structure and composition as the first buffer layer 13. The n-type layer 140 can be formed by n-type doping the gallium nitride layer 14. For example, an n-type layer can be obtained by doping phosphorus to a gallium nitride epitaxial layer. The p-type layer 160 can be formed by p-type doping. For example, a p-type layer 160 can be obtained by a boron doped gallium nitride epitaxial layer.

Figure 5:
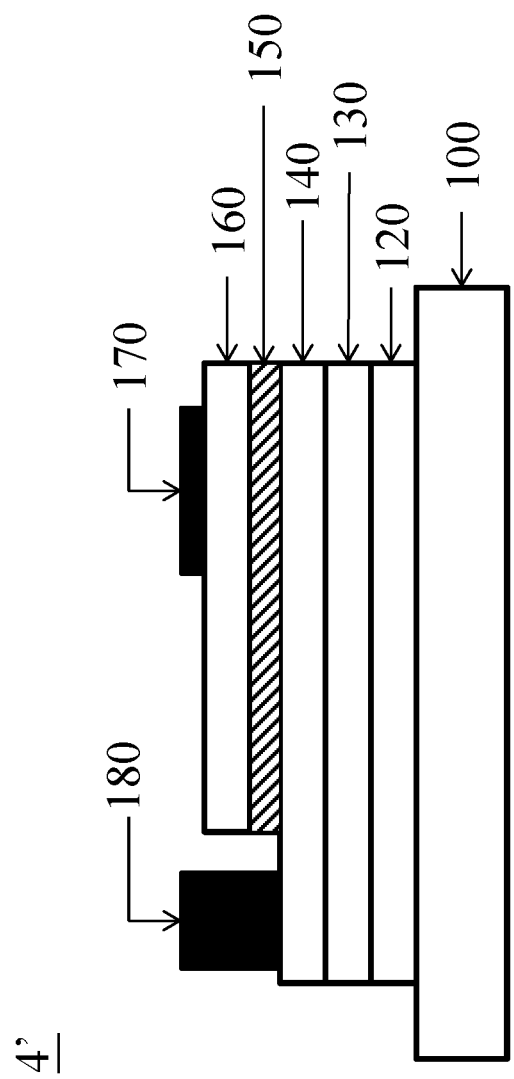
FIG. 5 shows a schematic diagram illustrating a semiconductor device according to example 5 of the invention.

FIG. 5 shows a schematic diagram illustrating a semiconductor device according to example 5 of the invention. The semiconductor device 4' comprises a supporting base plate 100, a silicon oxide layer 120, a first buffer layer 130, an n-type layer 140, a light emitting layer 150, a p-type layer 160, a contact electrode 170 in contact with the p-type layer 160, a contact electrode 180 in contact with the n-type layer 140. The difference between the semiconductor device 4 and semiconductor device 4' is that the light emitting layer 150 positioned between the n-type layer 140 and the p-type layer 160 is in the semiconductor device 4'. The light emitting layer 150 can be formed by a plurality of well layers and a plurality of barrier layer which are alternately laminated, that is, the laminate of one well layer, one barrier layer, one well layer, one barrier layer . . . is formed. Besides, the light emitting layer can be a quantum confinement layer formed by Al doped GaN with a high energy gap barrier and In (indium) doped GaN with a low energy gap barrier.

On the other hand, in examples 4 and 5, the silicon oxide layer 120 can be replaced by, for example, a plurality layers of silicon oxide layers 120-1, 120-2, 120-3 . . . . Besides, the modified example of examples 4 and 5 can have a titanium/platinum layer between the first buffer layer 130 and the n-type layer 140. The method to form the titanium/platinum layer is the same as the method to form titanium/platinum layer 13-1 described in the above.

Manufacturing a substrate for a semiconductor device specifically includes the following steps. A ceramic supporting base plate 10 (polycrystalline aluminum nitride) is coated with silicon oxide to form a silicon oxide layer 12 (planarization layer), then deposited with aluminum nitride to form a first buffer layer 13 (aluminum nitride thin film) by sputtering on the silicon oxide layer 12, and finally depositing a gallium nitride epitaxial layer by RF-MOMBE (radio-frequency metal-organic molecular beam epitaxy) on the first buffer layer 13. The supporting base plate 10 can be pre-treated, such as washed by acetone for 10 min, rinsed by iso-propyl alcohol (IPA) at 40° C. for 5 min to clean the surface of the supporting base plate 10 and heated by a hot plate at 120° C. for 5 min to dry moisture and IPA. The purpose of forming the silicon oxide layer by spin-coating is to fill holes on the surface of the polycrystalline aluminum nitride supporting base plate through filling the holes with the liquid phase of silicon oxide to smooth the surface or reduce the surface roughness. The reduction of the surface roughness can provide a better condition to deposit a gallium nitride thin film. To prevent cracking of aluminum nitride at 1000° C., the aluminum nitride supporting base plate can be annealed in a furnace at 1000° C. for 10 h at a heating rate controlled at 5° C./min and purged with nitrogen gas set to 100 sccm.

In the above semiconductor device, the silicon oxide layer has an average roughness less than the base plate to block polycrystalline orientation of the base plate and has a total thickness in a range of 10~5000 nm. The polycrystalline aluminum nitride supporting base plate has an average roughness more than 0.3 μm. Besides, preferably the average roughness of the silicon oxide layer is less than 10 nm, the total thickness of the silicon oxide layer is 100~1000 nm and the average roughness of the aluminum nitride supporting base plate is more than 30 nm. More preferably, the average roughness of the silicon oxide layer is less than 5 nm, the total thickness of the silicon oxide layer is 100~600 nm and the average roughness of the aluminum nitride supporting base plate is more than 30 nm.

In conclusion, according to the present invention, a substrate for a semiconductor device and a semiconductor device using the same are provided and the use of a polycrystalline aluminum nitride sintered bulk body provides a low-cost substrate instead of the high-cost single crystalline substrate. Besides, the present invention uses the sintered bulk body to increase the heat dissipation efficiency, forms the smooth silicon oxide layer (as a planarization layer) via solution coating on the rough surface of the sintered bulk body (polycrystalline aluminum nitride ceramic plate) and then grows the aluminum nitride epitaxial layer to provide a substrate ready for the epitaxial growth such as forming a GaN layer and light emitting layer. The process of manufacturing a substrate for a semiconductor device is simplified.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims. Each of the terms "first" and "second" is only a nomenclature used to modify its corresponding element. These terms are not used to set up the upper limit or lower limit of the number of elements.

What is claimed is:

1. A substrate for a semiconductor device comprising:
   a supporting base plate, made of ceramics and formed by a polycrystalline aluminum nitride (AlN) sintered bulk body;
   at least one silicon oxide layer, formed on the base plate by a sol-gel method wherein the at least one silicon oxide layer has an average roughness less than the base plate to block polycrystalline orientation of the base plate and has a total thickness in a range of 10~5000 nm, the silicon oxide layer is only formed from the sol-gel method using a spin-on glass coating (SOG) material and is not single crystalline;
   a first buffer layer, comprising aluminum nitride (AlN) formed on the at least one silicon oxide layer with a thickness of 0.1~10 μm and having a preferred orientation (002) AlN crystalline structure; and
   a gallium nitride layer, formed on the first buffer layer and having a single-crystalline crystalline structure.

2. The substrate as claimed in claim 1, wherein the average roughness of the top layer of the at least one silicon oxide layer is less than 25 nm.

3. The substrate as claimed in claim 1, wherein the at least one silicon oxide layer includes 1~10 layers.

4. The substrate as claimed in claim 1, further comprising:
   a titanium/platinum layer (titanium layer and/or platinum layer), formed on the at least one silicon oxide layer wherein the titanium layer has a thickness of 1~100 nm and the platinum layer has a thickness of 5~1000 nm.

5. A method for manufacturing a substrate for a semiconductor device comprising:
   providing a supporting base plate made of ceramics and formed by a polycrystalline aluminum nitride (AlN) sintered bulk body;
   performing a sol-gel process to form a silicon oxide layer at least one time wherein the sol-gel process is performed 1~10 times, the average roughness of the top layer of the at least one silicon oxide layer is less than 25 nm and the at least one silicon oxide layer has a total thickness in a range of 10~5000 nm;
   using a metal-organic chemical vapor deposition method to form a first buffer layer which comprises aluminum nitride (AlN) formed on the at least one silicon oxide layer; and
   using a metal-organic chemical vapor deposition method to form a gallium nitride layer formed on the first buffer layer and having a single-crystal crystalline structures;
   wherein the first buffer layer has a thickness of 0.1~10 μm and has a preferred orientation (002) AlN crystalline structure.

6. The method as claimed in claim 5, further comprising:
   Using a metal-organic chemical vapor deposition or physical vapor deposition method to form a titanium/platinum layer (titanium layer and/or platinum layer) on the at least one silicon oxide layer wherein the titanium layer has a thickness of 1~100 nm and the platinum layer has a thickness of 5~1000 nm.

7. A semiconductor device, comprising:
   a supporting base plate, made of ceramics and formed by a polycrystalline aluminum nitride (AlN) sintered bulk body;
   at least one silicon oxide layer, formed on the base plate by a sol-gel method wherein the at least one silicon oxide layer has an average roughness less than the base plate to block polycrystalline orientation of the base plate and has a total thickness in a range of 10~5000 nm, the silicon oxide layers is only formed from the sol-gel method and is not single crystalline;
   a first buffer layer, comprising aluminum nitride (AlN) formed on the at least one silicon oxide layer wherein the first buffer layer is of aluminum nitride (AlN) has a thickness of 0.1~10 μm and a preferred orientation (002) AlN crystalline structure;
   a gallium nitride layer, formed on the first buffer layer and having a single-crystal crystalline structure;

a light emitting layer on the gallium nitride layer, wherein the light emitting layer is a n-type layer and has a single-crystal crystalline structure; and a p-type layer on the light emitting layer.

8. The semiconductor device as claimed in claim 7, wherein the average roughness of the top layer of the at least one silicon oxide layer is less than 25 nm and the at least one silicon oxide layer has a total thickness in a range of 10~5000 nm.

9. The semiconductor device as claimed in claim 7, wherein the average roughness of the supporting base plate is equal to or more than 0.3 μm.

* * * * *